United States Patent
Ma et al.

(10) Patent No.: US 10,243,162 B2
(45) Date of Patent: Mar. 26, 2019

(54) CLOSE ILLUMINATION SYSTEM

(71) Applicant: Universal Display Corporation, Ewing, NJ (US)

(72) Inventors: Ruiqing Ma, Morristown, NJ (US); Jason Paynter, Bristol, PA (US); Jeffrey Silvernail, Yardley, PA (US); Julia J. Brown, Yardley, PA (US); Mauro Premutico, Brooklyn, NY (US)

(73) Assignee: Universal Display Corporation, Ewing, NJ (US)

( * ) Notice: Subject to any disclaimer, the term of this patent is extended or adjusted under 35 U.S.C. 154(b) by 342 days.

(21) Appl. No.: 15/160,309

(22) Filed: May 20, 2016

(65) Prior Publication Data

US 2016/0369988 A1 Dec. 22, 2016

Related U.S. Application Data

(60) Provisional application No. 62/180,917, filed on Jun. 17, 2015.

(51) Int. Cl.
| | |
|---|---|
| *H01L 51/52* | (2006.01) |
| *F21V 23/00* | (2015.01) |
| *G02B 25/02* | (2006.01) |
| *F21W 131/30* | (2006.01) |
| *F21Y 115/15* | (2016.01) |

(52) U.S. Cl.
CPC .......... *H01L 51/5237* (2013.01); *G02B 25/02* (2013.01); *H01L 51/5206* (2013.01); *H01L 51/5221* (2013.01); *H01L 51/5225* (2013.01); *F21W 2131/3005* (2013.01); *F21Y 2115/15* (2016.08); *H01L 2251/5338* (2013.01); *H01L 2251/5361* (2013.01)

(58) Field of Classification Search
None
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |

(Continued)

FOREIGN PATENT DOCUMENTS

| | | |
|---|---|---|
| EP | 2455993 A1 | 5/2012 |
| WO | 2008057394 | 5/2008 |
| WO | 2010011390 | 1/2010 |

OTHER PUBLICATIONS

Baldo, et al., "Highly efficient phosphorescent emission from organic electroluminescent devices", Nature, vol. 395, pp. 151-154, 1998.

(Continued)

*Primary Examiner* — Ashok Patel
(74) *Attorney, Agent, or Firm* — Morris & Kamlay LLP

(57) ABSTRACT

Devices suitable for close illumination of an object are provided. Such a device includes a highly transparent electrode and a highly reflective, weakly transmissive electrode, with other OLED layers disposed between them. During operation in close proximity to an object, the object is illuminated by the device, while still allowing a user to see through the device.

20 Claims, 12 Drawing Sheets

(56) References Cited

U.S. PATENT DOCUMENTS

| | | |
|---|---|---|
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,664,173 B2 | 12/2003 | Doyle et al. |
| 7,279,704 B2 | 10/2007 | Walters et al. |
| 7,431,968 B1 | 10/2008 | Shtein et al. |
| 7,845,826 B2 | 12/2010 | Aylward et al. |
| 7,968,146 B2 | 6/2011 | Wagner et al. |
| 8,979,291 B2 | 3/2015 | Billings et al. |
| 8,981,640 B2 * | 3/2015 | Levermore ............ H05B 33/10 313/504 |
| 2003/0230980 A1 | 12/2003 | Forrest et al. |
| 2004/0174116 A1 | 9/2004 | Lu et al. |
| 2012/0212931 A1 | 8/2012 | Kinoshita et al. |
| 2012/0286651 A1 * | 11/2012 | Levermore ............ H05B 33/10 313/504 |
| 2013/0135328 A1 | 5/2013 | Rappoport et al. |
| 2013/0140547 A1 * | 6/2013 | Lee .................... H01L 27/3274 257/40 |
| 2013/0229598 A1 | 9/2013 | Kamada |
| 2014/0110681 A1 | 4/2014 | Hack et al. |
| 2014/0139458 A1 | 5/2014 | Premutico et al. |
| 2016/0149161 A1 * | 5/2016 | Lee .................... H01L 51/5271 257/40 |
| 2017/0047380 A1 * | 2/2017 | Tsukamoto ............ H01L 51/50 |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

* cited by examiner

CLOSE ILLUMINATION SYSTEM

CROSS-REFERENCE TO RELATED APPLICATIONS

This application is a non-provisional application of, and claims priority benefit to U.S. Provisional Patent Application Ser. No. 62/180,917, filed Jun. 17, 2015, the entire contents of which is incorporated herein by reference.

PARTIES TO A JOINT RESEARCH AGREEMENT

The claimed invention was made by, on behalf of, and/or in connection with one or more of the following parties to a joint university corporation research agreement; Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to a close illumination system, and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

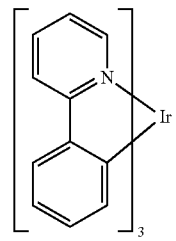

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, an organic light-emitting device is provided that includes a flexible substrate, a highly-transparent electrode layer disposed over the substrate, the highly-transparent electrode layer having a peak transmittance of at least 90% in the 400-700 nm range, an emissive layer comprising an organic emissive material disposed over the highly-transparent electrode, and a highly-reflective, weakly-transmissive electrode layer disposed over the emissive layer, where the highly-reflective, weakly-transmissive electrode has a minimum transmittance of not more than 20% and a peak reflectance of at least 50% in the 400-700 nm range. During operation of the device, the luminance measured from the side of the device closest to the substrate may be at least 8 times the luminance measured from the side of the device farthest from the substrate. The highly-reflective electrode layer may be a continuous layer, or a grid of reflective electrode material. Where a grid is used, it may occupy a total area of not more than 25% the total area of the emissive layer. The transmittance of the highly-reflective electrode layer may be not more than about 2% within the 400-700 nm wavelength range. The organic emissive layer may be patterned according to the grid of the highly-reflective electrode layer. The grid may have an arrangement such as square, rectangular, triangular, hexagonal, circle, oval, or combinations thereof. The grid may have grid lines of less than 500 µm, 200 µm, 150 µm, 100 µm, or 50 µm in width. The device may be a single-pixel organic light emitting device. At least one electrode of the device may have a non-uniform transmittance and/or reflectance within the 400-700 nm range.

In an embodiment, a device may include an organic light emitting device as described herein, a battery configured to provide a power to the OLED such as via a voltage across the organic emissive layer, a switch configured to control a circuit through which the battery provides the voltage, a driver configured to drive the organic light emitting device; and a mechanical package housing the battery, the switch, and the driver. The largest dimension of the mechanical package may be not more than ½ the largest dimension of an active area of the emissive layer. The mechanical package may be disposed adjacent to the OLED/emissive layer, i.e., not disposed in a stack with the emissive layer. Such a device may have a particular form factor, such as a bookmark. The device may be relatively small. For example, the mechanical packaging may have no dimension that is greater than about 50 mm. Similarly, the device may have a thickness not larger than 2 mm. The device may include other components, such as a magnification layer, a rechargeable battery, and/or an external charging port, for example in electrical communication with a rechargeable battery.

In an embodiment, a method of fabricating an organic light-emitting device is provided. The method may include obtaining a flexible substrate, fabricating a highly-transparent electrode layer disposed over the substrate, where the highly-transparent electrode layer has a peak transmittance of at least 90% in the 400-700 nm range, fabricating an emissive layer that includes an organic emissive material disposed over the highly-transparent electrode, and fabricating a highly-reflective, weakly-transmissive electrode layer over the emissive layer, which has a minimum transmittance of not more than 20% and a peak reflectance of at least 50% in the 400-700 nm range.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
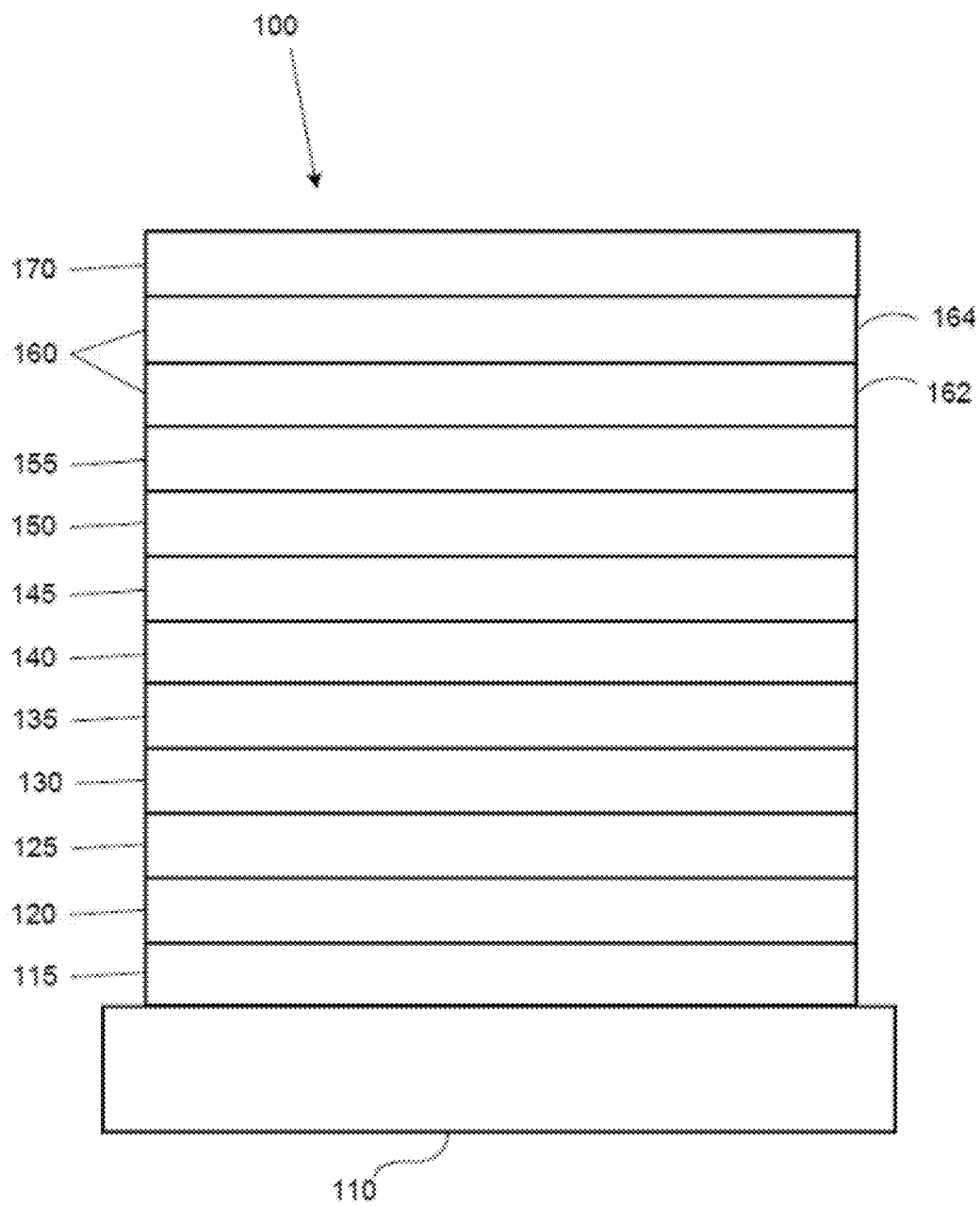
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
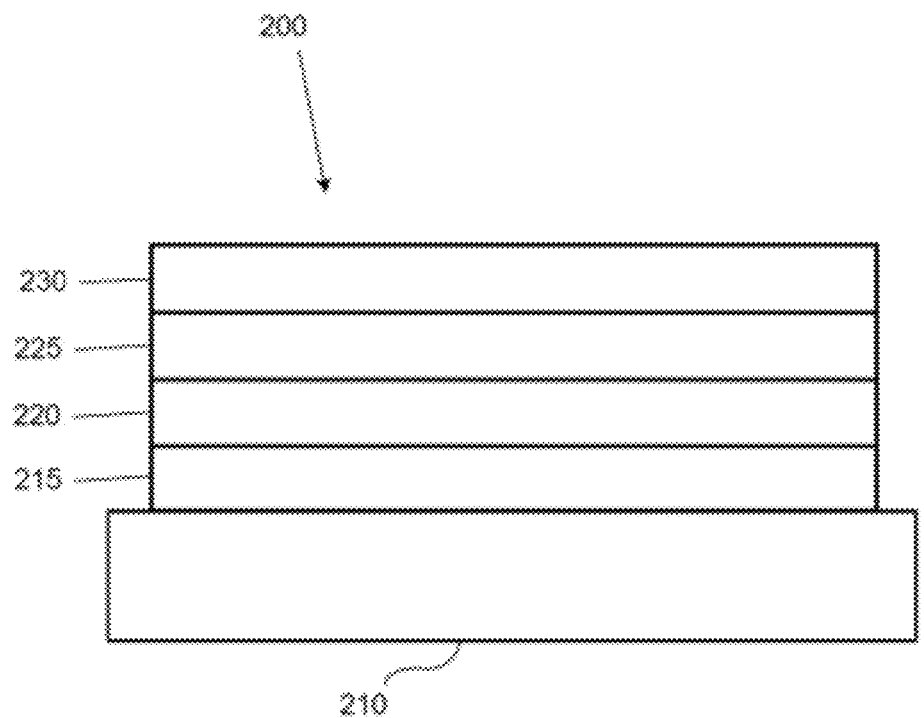
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos.

6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 C. to 30 C., and more preferably at room temperature (20-25 C.), but could be used outside this temperature range, for example, from −40 C. to +80 C.

OLEDs may provide for devices and uses that are impractical or impossible using other forms of illumination. For example, European patent application EP 2455993 discloses a front light system where a plurality of OLED elements is disposed between 2 transparent electrodes. A plurality of reflective plates is inserted between substrate and one of the electrodes corresponding to the plurality of OLED elements to reflect the light generated from each OLED element to one direction. In this way most light goes to one direction and there is only minimum light going to the other direction. Such a design may provide high reading contrast; however, fabricating the reflective plates is an extra step and fine patterning is needed to align the each reflective plate with the corresponding OLED element.

As another example, U.S. Pat. No. 8,979,291 relates to two transparent lighting panels that are configured in a back to back fashion, where each panel can be individually controlled. Part of the light generated in each panel will go through the other panel. US patent application publication 2014/0110681 discloses a device that is substantially transparent that emits a display image from one surface and acts as an illumination source from its second surface. US patent application publication 2014/0139458 discloses a novel device which displays images on both sides of surfaces. The image the viewers see from one side is identical to the image viewers see from the other side.

In contrast, embodiments disclosed herein provide a close illumination system that can serve as a see-through reading light or a see-through front light for print media or reflective electronic displays. For example, such a device may be embodied in a bookmark or other small form factor which, when placed against or in close proximity to printed text, illuminates the text while still allowing a user to view the text through the device.

Figure 3:
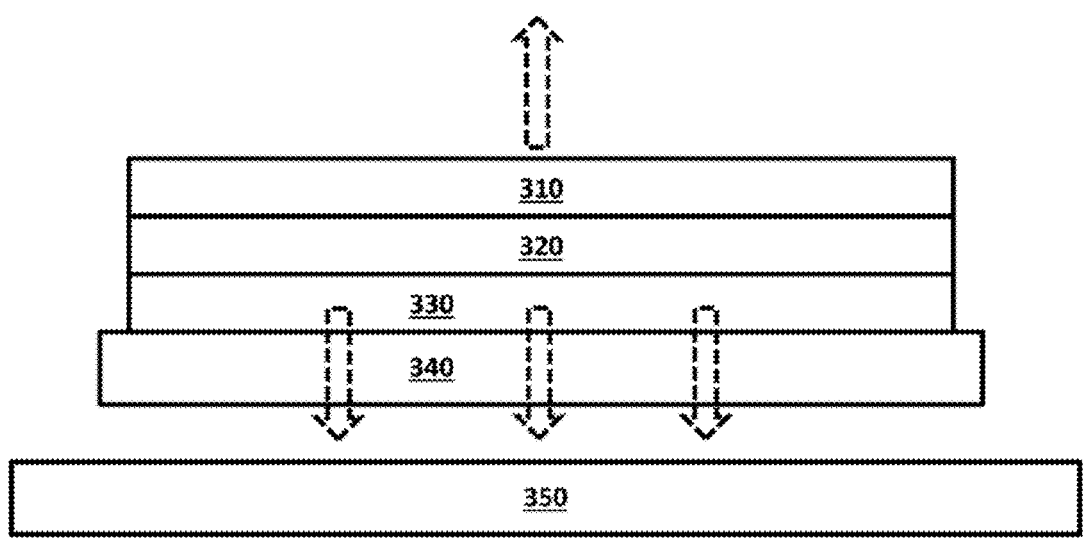
FIG. 3 shows a schematic representation of a close illumination system according to an embodiment of the present invention.

In an embodiment, an OLED device is provided that has a highly asymmetric brightness. An example of such a device is shown in FIG. 3. The device includes a substrate 340, a highly transparent electrode 330, a highly reflective and weakly transmissive electrode 310, and one or more organic electroluminescent layers 320 disposed between the two electrodes. The device may include other layers such as blocking layers, transport layers, and the like, as previously described with respect to FIGS. 1 and 2. The substrate, electrodes, and/or OLED layer(s) may be flexible, such that the device can be placed conformally over a non-planar surface such as an open book or other publication, a curved object such as a shipping canister, aluminum can, a curved wall, an architectural support post, a beverage container, or the like. When used to illuminate an object, the device may be disposed such that the highly transparent electrode 330 in close proximity, and is closer than the highly reflective weakly transmissive electrode 310, to the object to be illuminated 350. For example, when used to illuminate the page of a book or other printed matter 350, the device may be placed as shown in FIG. 3 such that light is emitted as shown by the dashed arrows, both toward the object 350 and away from the highly reflective, weakly transmissive electrode 310, but with more light emitted initially toward the object to be illuminated 350. Such an asymmetric brightness may be achieved through the use of electrodes having particular optical properties as described herein.

As described and shown in further detail herein, it may be desirable for the electrodes to have specific transmittance and reflectance properties. For example, the highly-transparent electrode 330 may have a peak transmittance of at least 90% within the 400-700 nm spectrum range. The highly-reflective, weakly-transmissive electrode 310 may have a minimum transmittance of not more than 20% in the 400-700 nm spectrum range, and/or a peak reflectance of at least 50% in the 400-700 nm spectrum range. In some embodiments it may be preferred for the weakly-transmissive electrode to be completely opaque to some or all wavelengths in the visible spectrum, i.e., to have a transmittance of 0% within the 400-700 nm range.

Figure 4A:
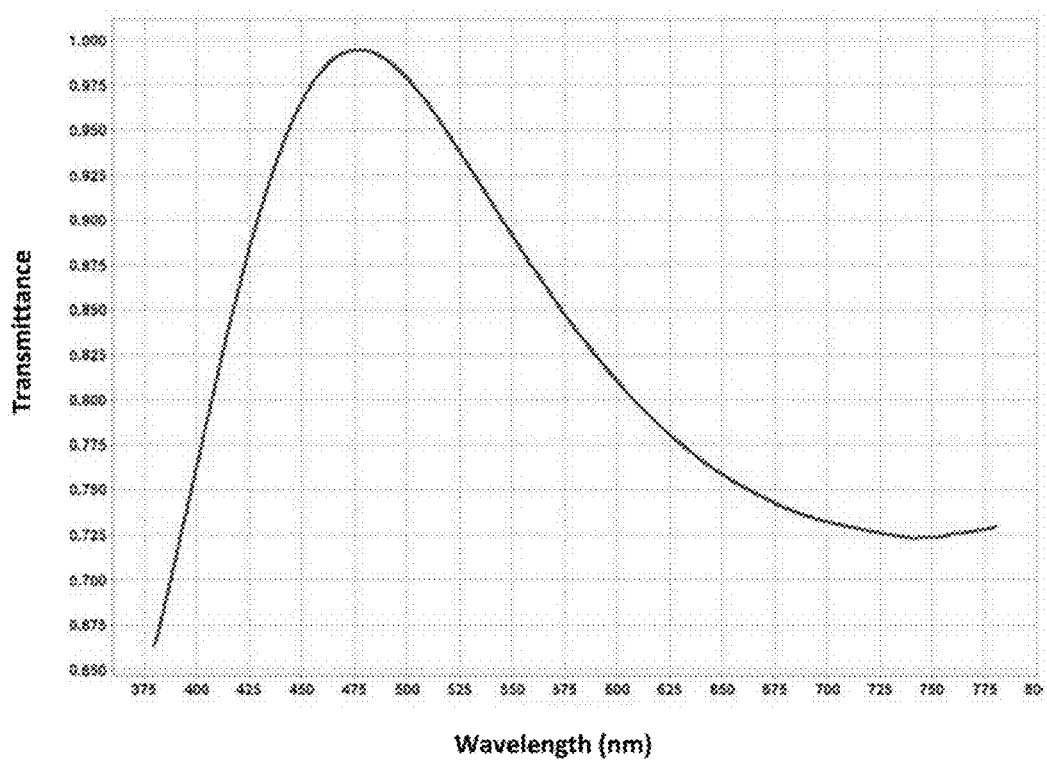
FIG. 4A shows the transmittance of an example anode as a function of wavelength in a close illumination system according to an embodiment of the present invention.
Figure 4B:
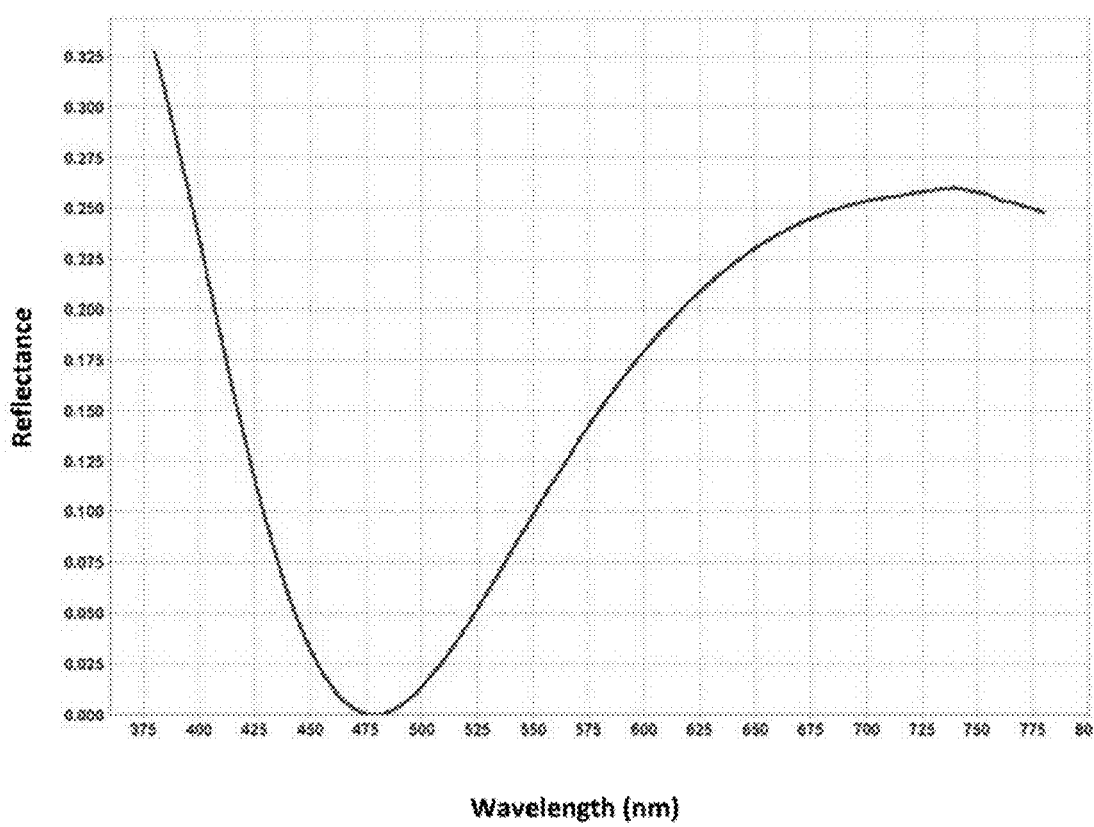
FIG. 4B shows the reflectance of an example anode as a function of wavelength in a close illumination system according to an embodiment of the present invention.
Figure 5A:
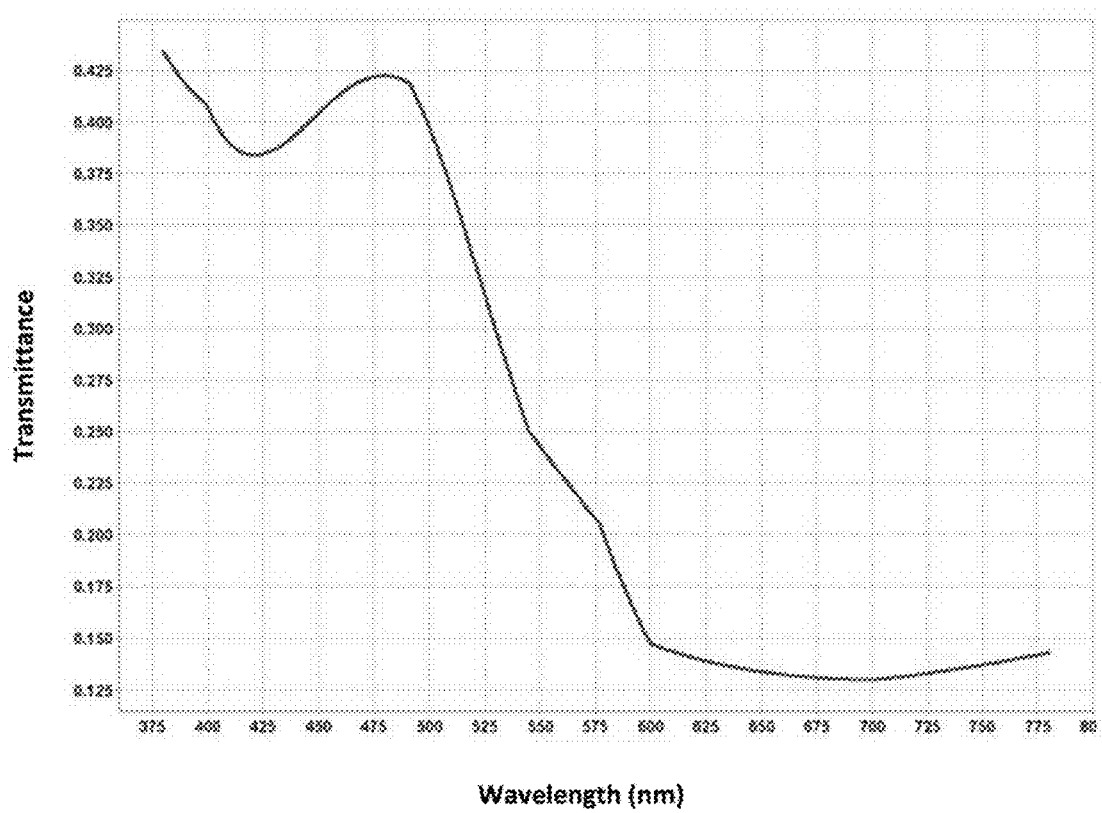
FIG. 5A shows the transmittance of an example cathode as a function of wavelength in a close illumination system according to an embodiment of the present invention.
Figure 5B:
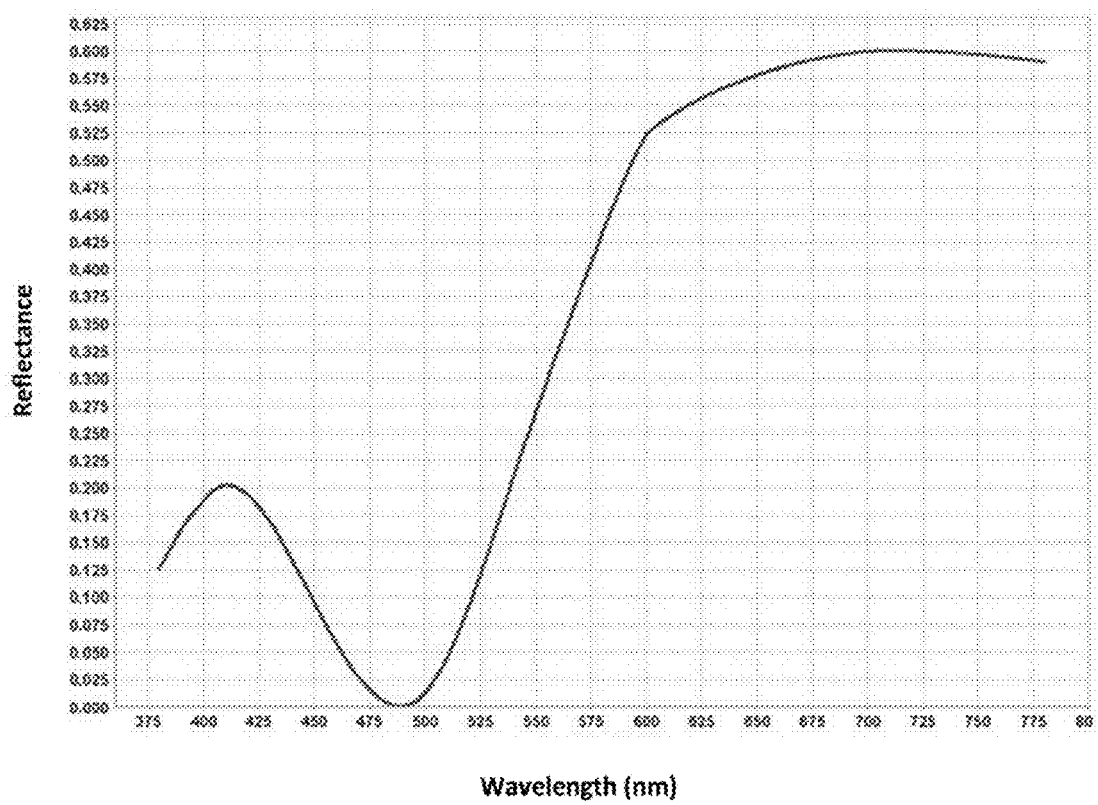
FIG. 5B shows the reflectance of an example cathode as a function of wavelength in a close illumination system according to an embodiment of the present invention.

More generally, it may be preferred for the highly-transparent electrode 330 to have a peak transmittance higher than the highly reflective, weakly transmissive electrode 310. It also may be preferred for one or both electrodes to have non-uniform transmittance and/or reflectance within the 400-700 nm range. For example, as shown in FIGS. 4 and 5, electrodes suitable for use with devices and systems disclosed herein may have transmittance profiles that vary between 65% and 100% (FIG. 4A), 10% and 45% (FIG. 5A), or the like, and/or reflectance profile that vary between 0% and 35% (FIG. 4B), 0% and 60% (FIG. 5B), or the like, within the 400-700 nm wavelength range. The use of non-uniform transmittance and reflectance profile electrodes may further enhance the optical qualities of the device, because, as explained in further detail below, these properties may cause the path traveled by light from two regions to be different.

In order to obtain desirable contrast levels when in use, it typically will be preferred for a device as disclosed herein to be placed very close to the text or other object to be illuminated. This allows most light which carries the information about the object ultimately to be reflected back toward the user, i.e., through the highly reflective, weakly transmissive electrode. The distance is preferred to be less than 10 mm, 5 mm, 2 mm, 1 mm, or even less. Typically, the device will be placed in direct physical contact with the device to be illuminated if possible, such as where printed material is being illuminated. To maintain a short distance regardless of the particular arrangement of the object being illuminated, it may be preferred for the device to be flexible, and thus able to conform to the surface of the image to be viewed. For example, a device such as the device shown in FIG. 6 may be fabricated on polymer substrate so it is flexible. Different thickness of plastic films can be used to laminate on top of the device; thicker films may provide additional protection, and higher rigidity. When polymer or plastic substrates are used, a thin film barrier may be used to encapsulate the OLED device so the overall device can be flexible. Both bottom emission and top emission OLEDs may be used.

For a close illumination device such as a see-through bookmark or other reading light as disclosed herein, it may be desirable for the device to provide a contrast ratio of 2:1 or higher. Such a ratio is reasonably within the range of comfort for a typical user, especially for black-white print in a low ambient light condition such as reading a book during the night. Specific examples of achievable contrast ratios are provided in further detail herein.

To improve the contrast ratio, the transmittance of the weakly transmissive electrode may be reduced. For example, in embodiments disclosed herein the transmittance of the weakly transmissive electrode may be less than 10%, 5%, 2% or less. This typically leads to an even larger ratio of the top and bottom luminance level. This ratio is preferred to be larger than 8:1, 10:1, 15:1, or 20:1. Higher contrast ratios may be achieved, for example, by using a thicker electrode with the same material, or by using a different, less transmissive electrode material.

Figure 6:
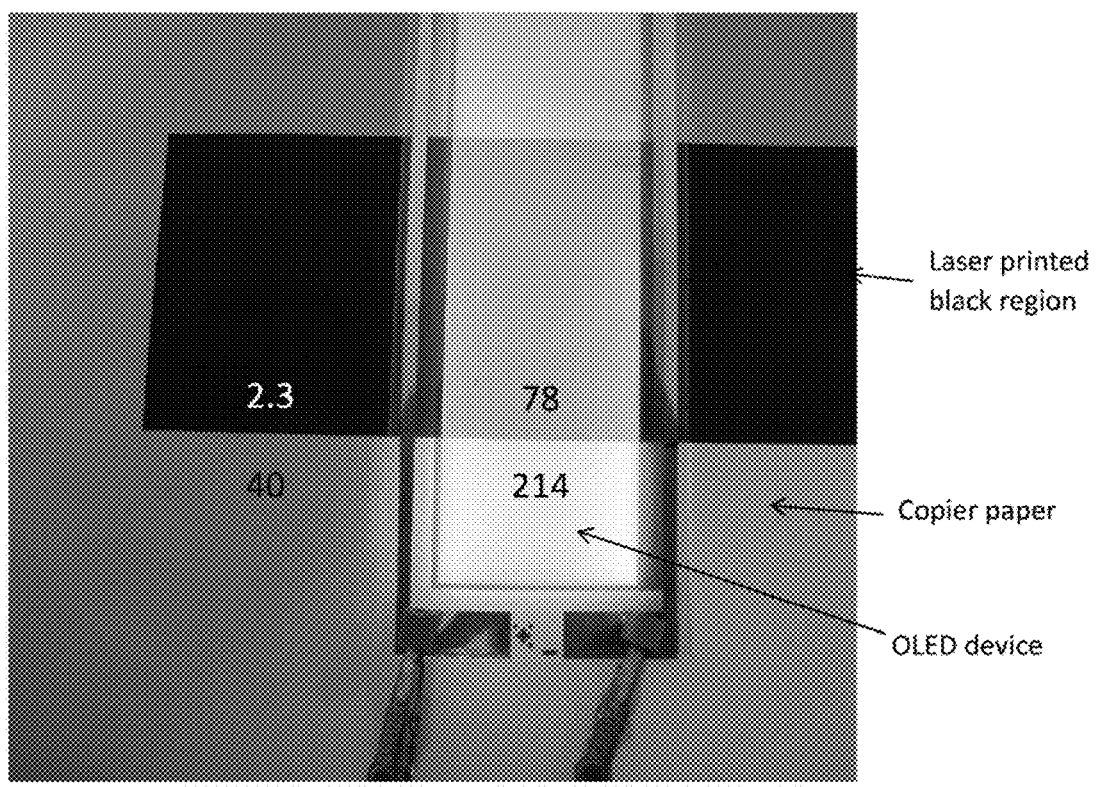
FIG. 6 shows luminance levels of a close illumination system at different positions according to an embodiment of the present invention.

In an embodiment, a close illumination device as disclosed herein may include a single large OLED pixel, such as the device shown in FIG. 6. That is, the electroactive area of the OLED may not include multiple, individually-addressable areas that make up the larger device, but instead may be a single area that is only addressable (i.e., can be activated to an on-state) as a whole. In such a configuration there is no patterning of the OLED or the electrode, thus allowing for fabrication using relatively simple processes with no requirement for precise alignment. Thus, the single-pixel arrangement may be significantly less complicated and less costly than a conventional display-type device that includes multiple pixels.

Figure 7:
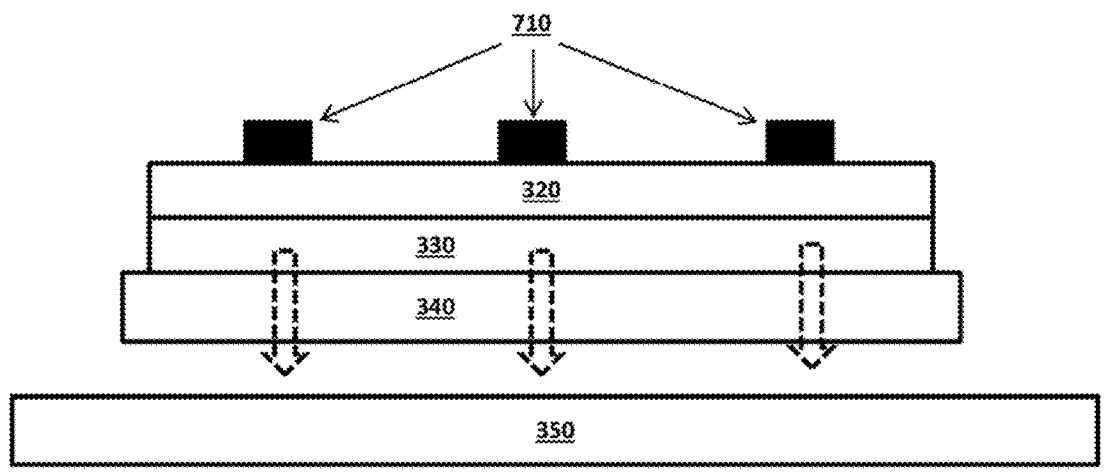
FIG. 7 shows a schematic representation of a close illumination system with a segmented, inter-connected reflective electrode according to an embodiment of the present invention.
Figure 9:
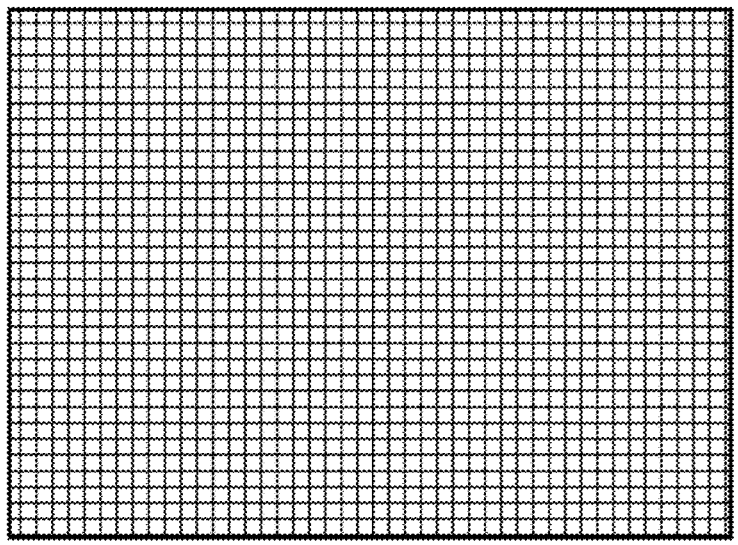
FIG. 9 shows a top view of segmented, inter-connected reflective electrode according to an embodiment of the present invention.

In an embodiment, higher contrast ratios may be achieved by reducing or eliminating emission from the top (weakly transmissive) side of the device. One technique to do so to use a segmented, but inter-connected grid of reflective electrode material instead of a solid continuous weakly transmissive electrode. An example configuration of such an electrode is shown in FIG. 9 as mesh of thin lines of reflective electrode. A schematic cross section of the device is shown in FIG. 7. The device in FIG. 7 has a structure similar to the structure shown in FIG. 3, but with an interconnected reflective electrode 710 instead of a continuous electrode layer 310. The OLED layer(s) 320 is still continuous in such a configuration. The reflective electrode layer 710 may be a grid as shown in FIG. 9, or any other arrangement such as a triangular grid, a hexagonal grid, a circular or oval grid, or a combination of these or any other shapes.

Figure 8:
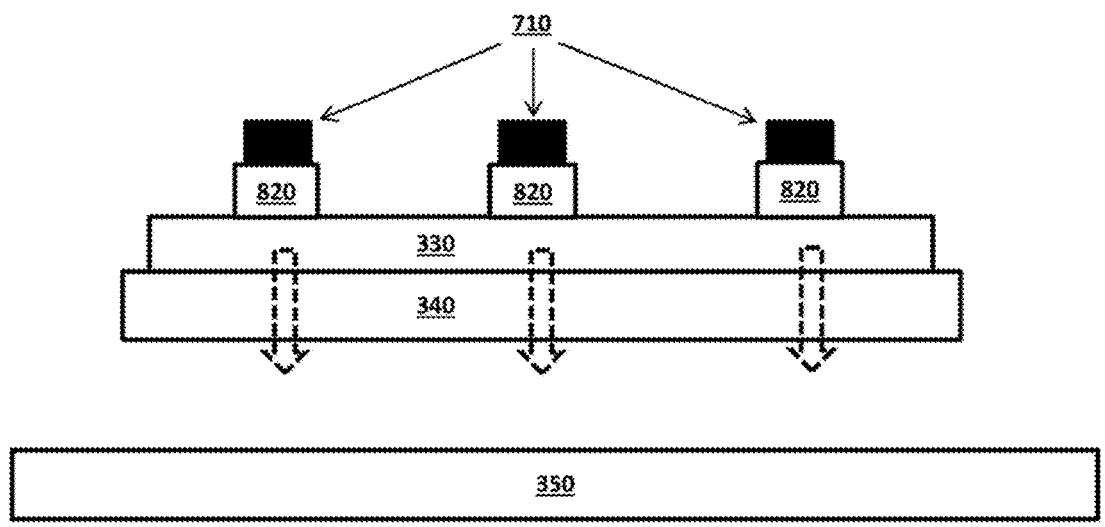
FIG. 8 shows a schematic representation of a close illumination system with a segmented, inter-connected reflective electrode and corresponding patterned OLEDs according to an embodiment of the present invention.

In an embodiment, the OLED layer also may be patterned according to the same pattern of the grid of electrode. An example of such an arrangement is shown in FIG. 8, which includes a patterned OLED layer 820. The footprint of the patterned layer 820 may be slightly larger than that of the electrode layer 710 to prevent shorting between the cathode and anode. That is, in each region that includes the OLED layer 820 and the electrode layer 710, the footprint of the OLED layer may extend beyond the footprint of the electrode layer 710. Thus the general arrangement and pattern of the electrode layer 710, such as the grid shown in FIG. 9 is maintained, while allowing the OLED layer 820 to prevent shorting between the electrodes 710, 330.

Since the reflective electrode blocks the view of the underlying images to be seen, it may be desirable for the dimension of the electrode to be relatively small. For example, the grid line should preferably be less than 500 µm, 200 µm, 150 µm, 100 µm, or 50 µm. The grid lines may be deposited using any suitable technique, including vacuum thermal evaporation, e-beam through a shadow mask, or patterned using photo-lithography. For example, in a printed letter-size text document using Times New Roman font with a font size of 12, the vertical lines have a width of about 300 µm. Since the grid lines shouldn't block this line, they need to have a width less than 300 µm. For example, the grid lines may be configured to have a width of 150 µm and a line-to-line separation of 1.5 mm. The total area occupied by such grid lines is about 19%. For grid line widths of 200 μm and 100 μm, the area ratios of the grid lines are 25% and 13%, respectively.

Figure 10:
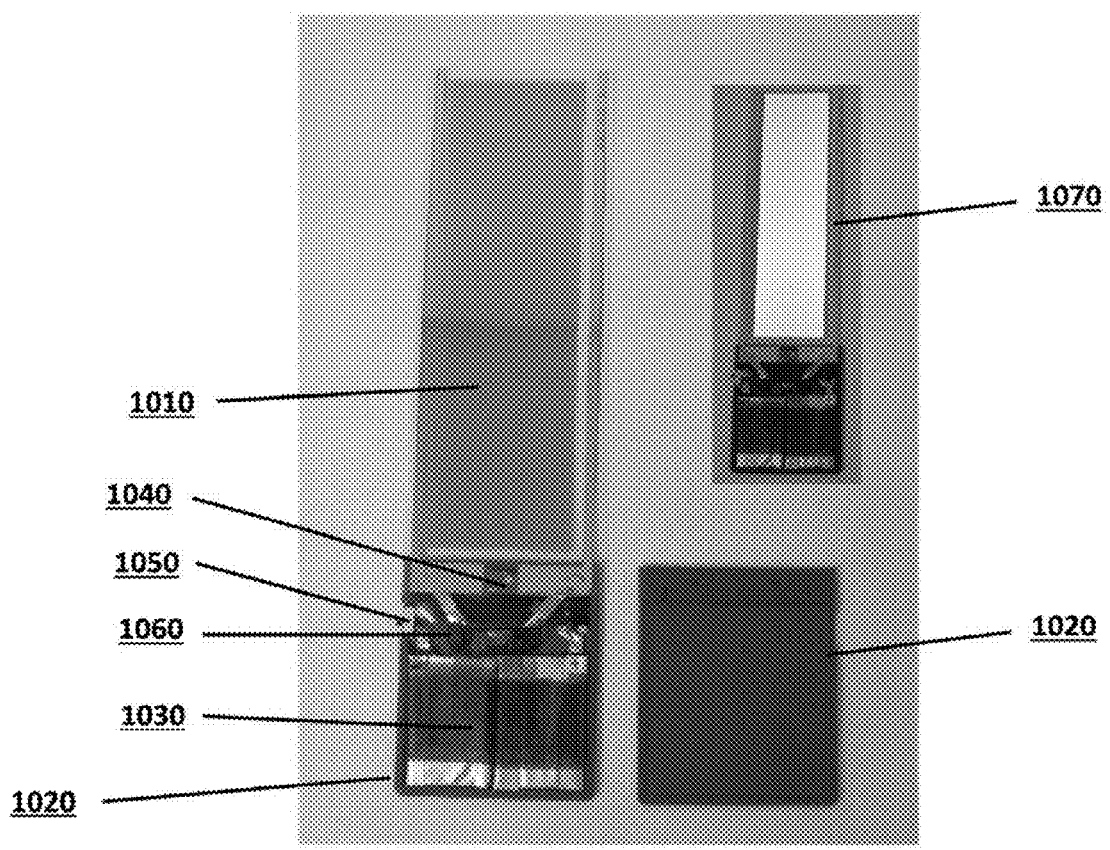
FIG. 10 shows example components of a portable illuminating bookmark according to an embodiment of the present invention.
Figure 11:
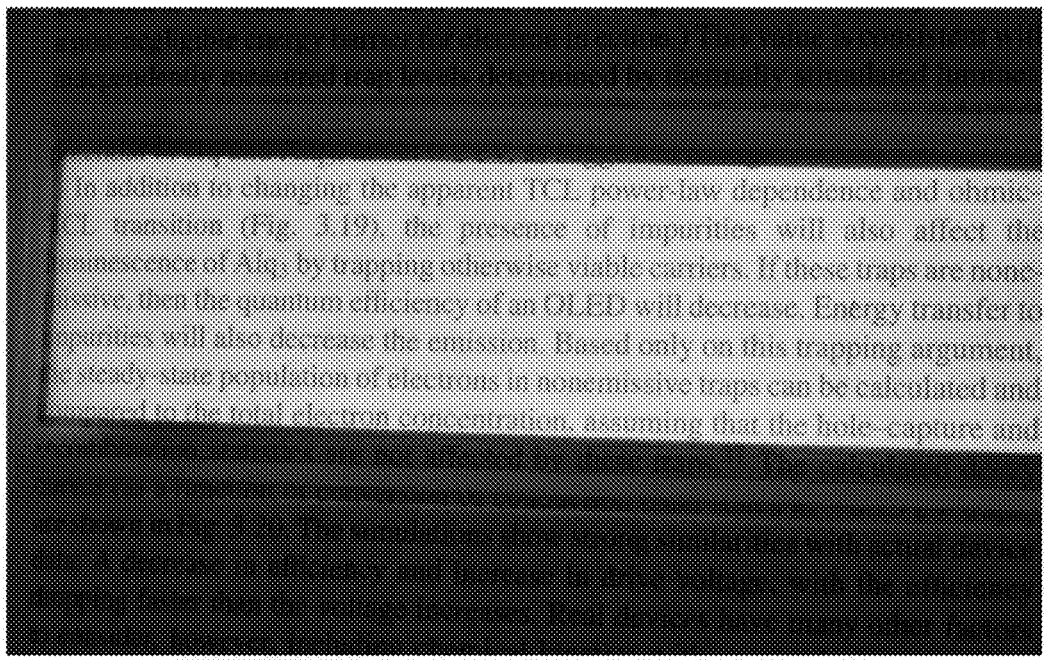
FIG. 11 shows the device of FIG. 10 illuminating a portion of printed text.

In an embodiment, a device such as a portable illuminating book mark may be fabricated based on the previously-described close illumination devices. A system according to such an embodiment is shown in FIG. 10. The device includes an OLED device 1010 as previously described, a mechanical package 1020, a battery 1030, and associated electronics such as a driver 1040 and a switch 1050. The electronics package may be connected to the OLED device by conventional electrical connections such as flexible wiring 1060 or other connections. A thin flexible battery may be used to achieve a relatively thin and flexible form factor. The insert of FIG. 10 shows the device at on-state 1070. FIG. 11 shows the device used to illuminate printed text in a dark environment. The use of an OLED in a device such as shown in FIGS. 10 and 11 may allow for a relatively small overall device while still achieving the illumination, optical, and flexibility properties disclosed herein, in comparison to conventional illumination devices. For example, the overall mechanical package used in conjunction with the electronics, power supply, and the like may be relatively small and/or flexible. For example, the largest dimension of the mechanical package 1020 may be only ½ the largest dimension of the active area of the OLED 1010, or smaller. Alternatively or in addition, the mechanical package may be relatively small regardless of the size of the OLED. For example, it may have no dimension (e.g., height, length, width) greater than about 50 mm. The mechanical package also may be disposed to one side of the OLED, as shown in FIG. 10, as opposed to being disposed in a stack with the OLED (i.e., adjacent to a largest surface area of the substrate and/or electrodes). As a result, a device as shown in FIG. 10 may be relatively thin, such as 2 mm in thickness or less.

A device such as the example shown in FIG. 10 may be enhanced with additional functions and/or features. For example, a thin, flat type of sheet magnifier can be attached to the OLED to facilitate the easy of reading. An example of such a sheet magnifier is the Mighty Bright made by Gold Crest LLC. As another example, a rechargeable battery may be used, in which case the device also may include an externally-accessible port to allow electrical access to the battery.

More generally, embodiments disclosed herein may provide any close illumination system where the ability for a user to see through the device, while illuminating an object on the far side of the device, is required. For example, a close illumination device as disclosed herein may be used as the front light on top of reflective displays.

Devices as disclosed herein may be fabricated by fabricating an OLED device as previously described, and by connecting other components such as the driver, battery, switch, and the like to the OLED. For example, a highly-transparent electrode layer may be disposed over a substrate, followed by an OELD including an emissive layer and a highly reflective, weakly transmissive electrode. The electrodes and the OLED layer may have the optical properties and physical arrangements previously disclosed herein. For example, the OLED may be fabricated using any suitable technique, such as disclosed with respect to FIG. 1 and FIG. 2. The layers of the device also may be fabricated in a different order and/or arrangement as described with respect to OLED fabrication processes herein, such as where the highly transparent electrode and the OLED are fabricated over the highly reflective, weakly transmissive electrode.

EXPERIMENTAL

An illustrative OLED device was fabricated as disclosed herein. The anode and cathode properties of the fabricated device are shown in FIG. 4 and FIG. 5, respectively. At 600 nm, the anode is highly transparent (81% transmittance), and the cathode is weakly transmissive (15% transmittance) but highly reflective (53% reflectance). The luminance of the device was measured using a Konica Minolta Chroma Meter CS-100A. The luminance levels were found to be 600 cd/m$^2$ and 75 cd/m$^2$ from the anode and cathode sides, respectively. As previously described, the luminance from the two sides is highly asymmetric with a ratio of 8:1. This high ratio may allow for reasonable contrast ratio when the device is placed on top of an image, as previously described herein.

The device was then placed on top of a black and white image formed by printing a black rectangle on standard copier paper using laser printing tool. The luminance was measured under standard lab ambient conditions. The white and black regions were measured to have luminance levels of 40 cd/m$^2$ and 2.3 cd/m$^2$, respectively, as shown in FIG. 6. This corresponds to a contrast ratio of about 17:1. The OLED device was then placed on top of the images with the brighter side facing the image. The luminance levels were measured again for the black and white regions. The distance between the device and the underlying image was less than 2 mm during the measurement. The white and black regions have luminance levels of 214 cd/m$^2$ and 78 cd/m$^2$ respectively, as shown in FIG. 6, thus providing a contrast ratio of 2.7:1. The low contrast ratio results primarily from emission of light through the weakly transmissive cathode. This part of light is the constant background similar to the reflection of ambient light on top of an electronic display. However, for a close illumination application such as a see-through book-mark/reading light, a contrast ratio of 2:1 and higher is very reasonable, especially for black-white print in a low ambient light condition such as reading a book during the night.

Another factor that distinguishes the two states is the spectrum, or color, of the light from the states. In the example shown in FIG. 6, the color of the light from the white and black regions are different. This is because the path, or history, of the light from the two regions are different. The light from the black region is mainly the light emitted through the top cathode. In contrast, within the white region, the majority of the light comes from the light emitted through the bottom anode, and then recycled back. Part of this light is recycled multiple times. As a result, the spectra of the white and black regions is quite different, as shown in FIG. 6. This will greatly help an observer to distinguish the two states, effectively providing a greater apparent contrast ratio.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic light-emitting device comprising:
    a flexible substrate;
    a highly-transparent electrode layer disposed over the substrate, the highly-transparent electrode layer having a peak transmittance of at least 90% in the 400-700 nm range;
    an emissive layer comprising an organic emissive material disposed over the highly-transparent electrode; and
    a highly-reflective, weakly-transmissive electrode layer disposed over the emissive layer, the highly-reflective, weakly-transmissive electrode having a minimum transmittance of not more than 20% and a peak reflectance of at least 5% in the 400-700 nm range.

2. The device of claim 1, wherein, during operation of the device, a first luminance measured from the side of the device closest to the substrate is at least 8 times a second luminance measured from the side of the device farthest from the substrate.

3. The device of claim 1, wherein the highly-reflective electrode layer comprises a continuous layer.

4. The device of claim 1, wherein the highly-reflective electrode layer comprises a grid of reflective electrode material.

5. The device of claim 4, wherein the grid of reflective electrode material occupies a total area of not more than 25% the total area of the emissive layer.

6. The device of claim 4, wherein the transmittance of the highly-reflective electrode layer is not more than about 2% within the 400-700 nm wavelength range.

7. The device of claim 4, wherein the organic emissive layer is patterned according to the grid of the highly-reflective electrode layer.

8. The device of claim 4, wherein the grid comprises a grid arrangement selected from the group consisting of: square, rectangular, triangular, hexagonal, circle, oval, and a combination thereof.

9. The device of claim 4, wherein the grid comprises grid lines of less than 500 μm in width.

10. The device of claim 4, wherein the width of the grid lines is selected from a group consisting of: less than 200 μm, less than 150 μm, less than 100 μm, and less than 50 μm.

11. The device of claim 1, wherein the organic light emitting device is a single-pixel device.

12. The device of claim 1, wherein at least one of an electrode of the highly-transparent electrode layer has a non-uniform transmittance within the 400-700 nm range and an electrode of the highly-reflective, weakly-transmissive electrode layer has a reflectance within the 400-700 nm range.

13. A device comprising:
    the organic light emitting device of claim 1;
    a battery configured to provide a voltage across the organic emissive layer;
    a switch configured to control a circuit through which the battery provides the voltage;
    a driver configured to drive the organic light emitting device; and
    a mechanical package housing the battery, the switch, and the driver;
    wherein the largest dimension of the mechanical package is not more than ½ the largest dimension of an active area of the emissive layer, and the mechanical package is not disposed in a stack with the emissive layer.

14. The device of claim 13 wherein the device is a bookmark.

15. The device of claim 14, wherein no dimension of the mechanical packaging is greater than about 50 mm.

16. The device of claim 13, wherein the device is not thicker than 2 mm.

17. The device of claim 13, further comprising a magnification layer.

18. The device of claim 13, wherein the battery is a rechargeable battery.

19. The device of claim 18, further comprising an external charging port in electrical communication with the rechargeable battery.

20. A method of fabricating an organic light-emitting device, the method comprising:
    obtaining a flexible substrate;
    fabricating a highly-transparent electrode layer disposed over the substrate, the highly-transparent electrode layer having a peak transmittance of at least 90% in the 400-700 nm range;
    fabricating an emissive layer comprising an organic emissive material disposed over the highly-transparent electrode; and
    fabricating a highly-reflective, weakly-transmissive electrode layer disposed over the emissive layer, the highly-reflective, weakly-transmissive electrode having a minimum transmittance of not more than 20% and a peak reflectance of at least 50% in the 400-700 nm range.

* * * * *